US005988314A

United States Patent [19]

Negishi

[11] Patent Number: 5,988,314

[45] **Date of Patent: *Nov. 23, 1999**

[54] SOUND OUTPUT SYSTEM

[75] Inventor: Hirokazu Negishi, Epsom, United Kingdom

[73] Assignee: Canon Kabushiki Kaisha, Tokyo, Japan

[ * ] Notice: This patent is subject to a terminal disclaimer.

[21] Appl. No.: 08/166,984

[22] Filed: Dec. 15, 1993

Related U.S. Application Data

[63] Continuation of application No. 07/866,110, Apr. 7, 1992, abandoned, which is a continuation of application No. 07/472,286, Jan. 30, 1990, abandoned, which is a division of application No. 07/280,936, Dec. 7, 1988, Pat. No. 5,144, 670.

[30] Foreign Application Priority Data

| | | | |
|---|---|---|---|
| Dec. 9, 1987 | [GB] | United Kingdom | 8728793 |
| Nov. 4, 1988 | [GB] | United Kingdom | 8825881 |

[51] Int. Cl.$^{6}$ .............................. H05K 5/00; G10K 11/00

[52] U.S. Cl. .......................... 181/144; 181/146; 181/155; 181/191; 181/199

[58] Field of Search .................................... 181/144, 145, 181/153, 154, 155, 191, 192, 194, 195, 199, 146, 151

[56] References Cited

U.S. PATENT DOCUMENTS

| | | | |
|---|---|---|---|
| 1,813,208 | 7/1931 | Smythe | 181/194 X |
| 1,943,499 | 1/1934 | Williams | 181/195 X |
| 2,065,367 | 12/1936 | Evans | 181/144 |
| 2,973,824 | 3/1961 | Pinski | 181/144 |
| 3,326,321 | 6/1967 | Valuch | 181/144 |
| 3,765,504 | 10/1973 | Itoh | 181/154 |
| 3,816,672 | 6/1974 | Gefvert et al. | 181/144 |
| 4,085,289 | 4/1978 | Schmideler | 181/153 X |
| 4,164,988 | 8/1979 | Virva | 181/153 X |
| 4,200,170 | 4/1980 | Williams, Jr. | 181/155 |
| 4,225,010 | 9/1980 | Smith | 181/155 |
| 4,227,050 | 10/1980 | Wilson | 181/144 |
| 4,348,750 | 9/1982 | Schwind | 181/155 |
| 4,357,490 | 11/1982 | Dickey | 181/145 |
| 4,429,762 | 2/1984 | Cesati | 181/192 X |
| 4,475,620 | 10/1984 | Carlsson | 181/155 |
| 4,496,021 | 1/1985 | Berlant | 181/195 X |
| 4,549,631 | 10/1985 | Bose | 181/155 |
| 4,624,337 | 11/1986 | Shavers | 181/155 |

FOREIGN PATENT DOCUMENTS

| | | | |
|---|---|---|---|
| 1077151 | 11/1954 | France | 181/155 |
| 2325603 | 5/1974 | Germany | 181/155 |
| 21888114 | 10/1987 | United Kingdom . | |

OTHER PUBLICATIONS

A. H. Benade, "From Instrument to Ear in a Room: Direct or Via Recoring"; Journal of The Audio Engineering Society, Apr. 4, 1985, pp. 218–233.

*Primary Examiner*—Eddie C. Lee

*Attorney, Agent, or Firm*—Fitzpatrick Cella Harper & Scinto

[57] ABSTRACT

A sound output system has a pair of right and left speakers and a pair of audio mirrors for respectively controlling directivities of sounds which are output from the pair of speakers. The shapes or arrangement of the pair of audio mirrors are adjusted such that a difference between arrival times of the sounds which are respectively output from the pair of speakers can be compensated by a sound pressure difference due to the Haas effect in a predetermined area. Alternative means are phase difference, dipole, and asymmetrical horn loading.

6 Claims, 15 Drawing Sheets

(REFLECTION PLANE 45° LINES)

$$\frac{\lambda}{2} = \frac{\ell}{\sqrt{2}}$$

$\frac{\lambda\%}{2} = \frac{\ell}{\sqrt{2}}$

SOUND OUTPUT SYSTEM

This application is a continuation of application Ser. No. 07/866,110 filed Apr. 7, 1992, now abandoned which is a continuation application of Ser. No. 07/472,286 filed Jan. 30, 1990, abandoned which is a divisional application of Ser. No. 07/280,936 filed Dec. 7, 1988 now U.S. Pat. No. 5,144,670.

BACKGROUND OF THE INVENTION

1. Field of the Invention

The present invention relates to a sound output system and, more particularly, to a sound output system to reproduce a stereophonic sound field with the high fidelity.

2. Description of the Related Art

In the audio field, an era of CD (compact disc player) and DAT (digital audio tape recorder) has come and what is called a sound quality is remarkably improved. However, when considering the viewpoint of high-fidelity (Hi-Fi) stereos, it is the main stream as usual that with respect to the output sections of the audio signals of the high sound quality, the ideal listening point is located at only the apex of an isosceles triangle which is formed by setting the straight line connecting two speakers as its bottom side. Therefore, the ideal audio system in which the listener can enjoy listening to the true Hi-Fi stereo-phonic sounds in a large listening area is not realized yet. This is because it is mainly considered that the directional distribution of the acoustic energies from the sound output section is not controlled.

In U.K. Patent Application No. 2188811A, the inventor of this patent application has already proposed a sound output system which can control a directional distribution in a wide area. The present invention relates to the improvement of this prior art. Hitherto, various kinds of techniques have been tried to enlarge the listening area in which the stereophonic feeling can be obtained (hereinafter, referred to as a sweet area). The following prior arts have been known as such conventional techniques.

(1) Diffusion sound field type system of Bose Co., Ltd. in U.S.A.

(2) VSS-70 system for an AV (audio/visual) system of Pioneer Electronic Corporation.

Since the system of the item (1) has been described in detail in the specification of U.K. Patent Application No. 2188811A only the essential points will be shown here.

(1) Drawbacks of the diffusion sound field type speaker system of Bose Co., Ltd. in U.S.A.:

(a) Drawback regarding the phase:

The speaker of Bose Co., Ltd. uses a method whereby the acoustic energies are radiated to both of the front area (for the direct sounds) and the rear area (for the indirect sounds) and the acoustic energies in both of the front and rear areas are used, thereby enlarging the sweet area. Therefore, the phase of the direct sound and the phase of the primary reflection sound from the wall surface on the rear side of the speaker mixedly exist.

(b) Drawback regarding the control of the indirect sound:

In spite of the fact that the primary reflection sound has the main part, the primary reflection sound can be adjusted by only the limited adjusting means such as setting of the speaker or the like. This system cannot cope with a variety of listening rooms.

In consideration of the above drawbacks, the Bose's speaker system is not regarded as a true Hi-Fi stereo of the wide area type.

(2) VSS-70 system of Pioneer Electronic Corporation:

Pioneer Electronic Corporation has developed the VSS-70 system to enlarge the sweet area for the AV. The VSS-70 system has been designed by considering a known sound effect called a Haas effect in a manner such that the central sound source can be localized at the center even at the locations other than the apex of the isosceles triangle (hot spot). Practically speaking, the sound which arrives from the distant speaker with a delay time is enhanced and the influence by the sound which has already arrived early from the near speaker is set off, thereby localizing the sound image at the center. For this purpose, it is inevitable to accurately control the sound pressure at frequencies of a wide frequency band at each listening point. In the case of stereophonic sound reproduction, the localization of the sound image depends on the sound pressures of the direct sounds which are generated from the right and left speakers. Therefore, it is important to control the directivity at each frequency.

However, in the case of the VSS-70 system, the directivities of the median and high tones are not sufficiently controlled as will be obvious from a diagram (FIG. 1) showing their directivity patterns. For example, shown in FIG. 1, within a range of 45° toward the inside from the front position, dips of 10 to 15 dB exist at the frequencies of 3 kHz and 10 kHz and their angles also differ. Thus, the sound image moves in the listening area every frequency. It can be said that the technique does not match with the purpose of the design.

On the other hand, the sound output system according to the patent application of the present inventor mentioned above is a new sound output system with respect to the point that the directional distribution in a wide area can be certainly controlled by adjusting the shape and arrangement of the audio mirror. The technique is such that the azimuth near a special direction is controlled in accordance with the object and use of the speaker. This invention also includes the technique of the variable type sound output system such that the directional distribution can be controlled in accordance with a environment of listening room. The present inventor has examined the extent of the listening area in which the stereophonic sound feeling is obtained in many embodiments. Thus, the following conclusions were obtained.

(a) As compared with the ordinary speaker system, the stereophonic listening area is obviously wide.

(b) However, with regard to the localization of the central sound source, in the case of what is called an omnidirectional speaker system, it is relatively limited to the position near the hot spot. On the other hand, when the directional speaker system is set so as to be localized to a special direction, the sweet area is obviously fairly widened.

As described above, in the case of the speaker system using the audio mirror, the listening area where the stereophonic sound feeling is derived is obviously wide. However, it is clear that the sweet area which can also localize the central sound source is influenced by the other conditions.

SUMMARY OF THE INVENTION

The present invention is made in consideration of the foregoing problems and it is one object amongst others, of the invention to provide a sound output system in which a listening area where the stereophonic sound feeling can be obtained is widely set.

According to one aspect of the present invention, there is provided a sound output system comprising a pair of right and left speakers and a pair of audio mirrors attached thereto, wherein the shapes or arrangement of the audio mirrors are adjusted such that the difference between the arrival times of the sounds from the pair of speakers can be compensated in a predetermined range by the sound pressure difference due to the Haas effect. There are also other useful means to achieve the same effect.

The above and other objects and features of the present invention will become apparent from the following detailed description and the appended claims with reference to the accompanying drawings.

DETAILED DESCRIPTION OF PREFERRED EMBODIMENTS

Figure 2A:
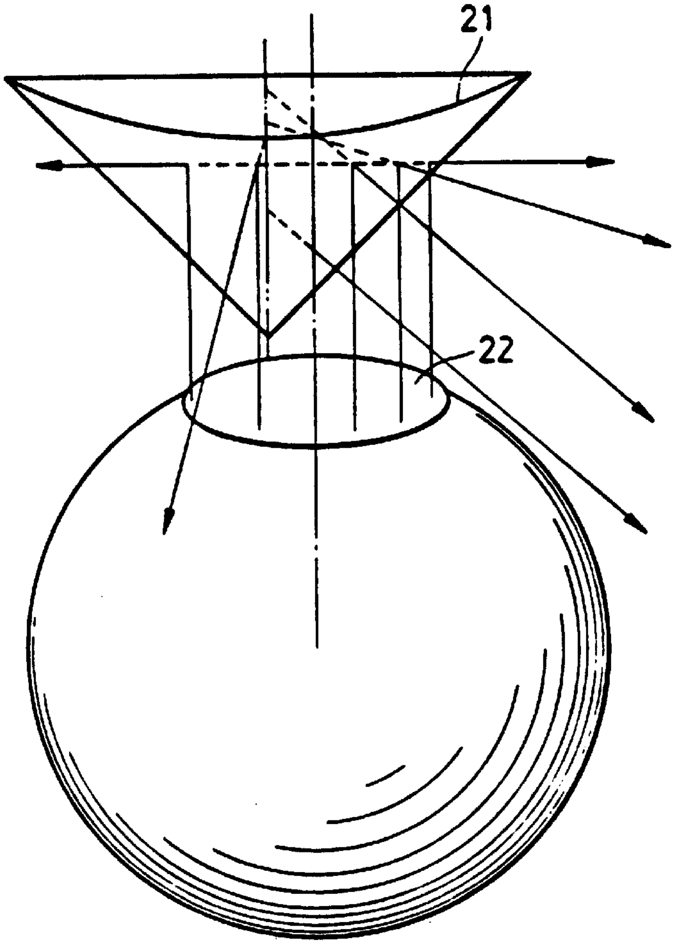
FIG. 2A is a diagram showing a schematic constitution of a sound output section according to an embodiment of the present invention.
Figure 2B:
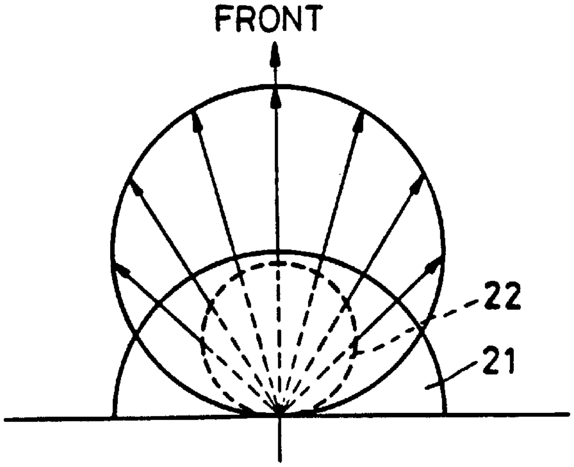
FIG. 2B is a diagram showing a directivity of the sound output section of FIG. 2A.
Figures 3A, 3B:
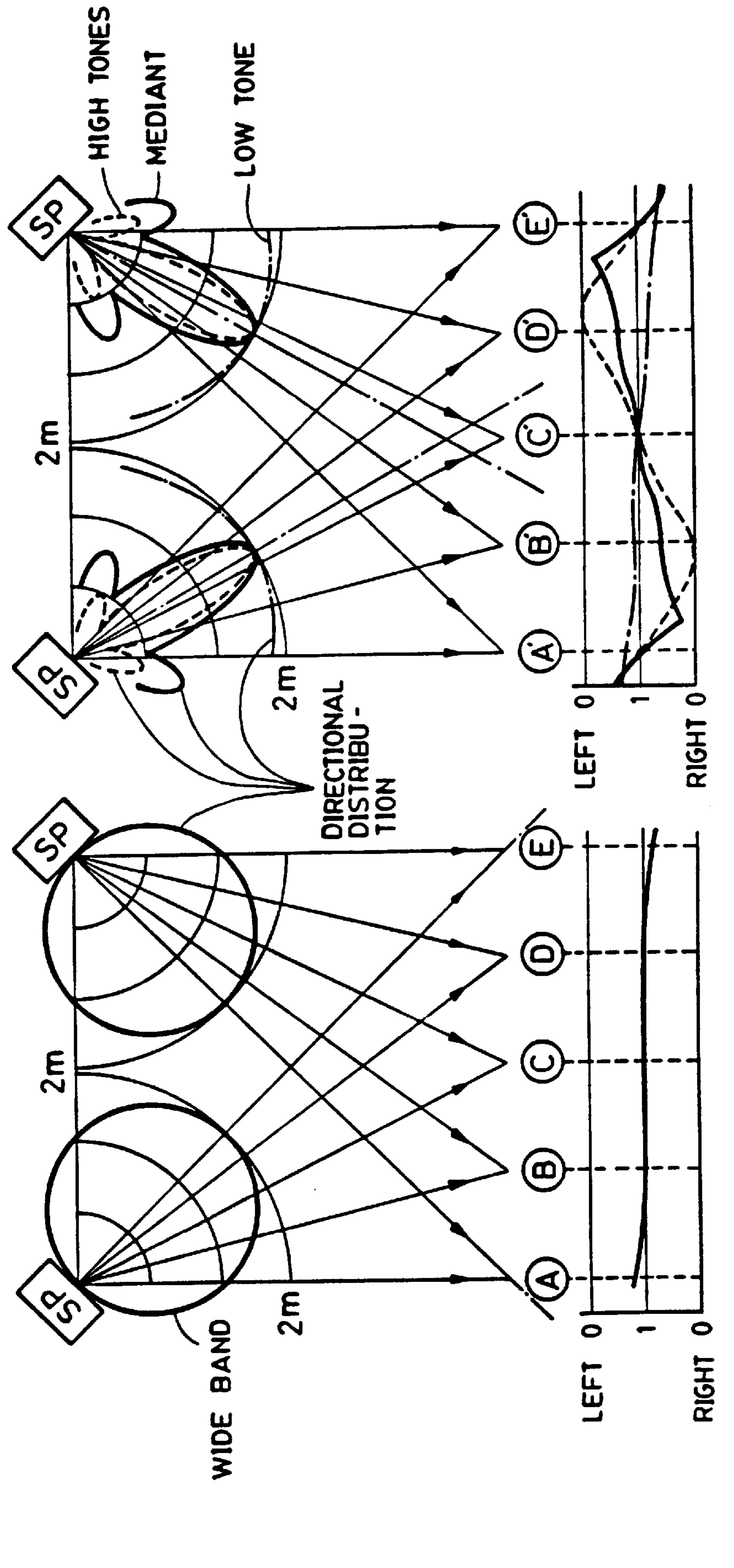
FIG. 3B PRIOR ART
FIG. 3A is a diagram showing a constitution and a characteristic of a stereophonic sound output system as an embodiment of the invention.
FIG. 3B is a diagram showing a constitution and a characteristic of a conventional stereophonic sound output system.

FIGS. 2A and 2B are diagrams showing an audio mirror speaker according to an embodiment of the present invention. FIG. 3A shows the principle of a sound output system as an embodiment of the invention and a sound image localization capability distribution.

As also shown in the UK Patent Application 2188811A by the present inventor mentioned above, FIGS. 2A and 2B are diagrams showing a speaker system and its directivity in the case where the central axis of an audio mirror 21 of a conical rotary unit is made coincident with the outer periphery of a circular diaphragm 22. In the foregoing prior art patent application, an attention has been paid to that the smooth directional distribution having a change of only ±7% is obtained over a range from +30° to −30° from the front position. However, this embodiment uses a theory such that the acoustic output smoothly decreases to 70% within a range from +45° to −45° from the front position.

FIG. 3A shows a state in that each speaker shown in FIG. 2A is located so as to face the position which is inside by an angle of 45°, thereby constituting a pair of speakers adapted to reproduce the stereophonic sounds. The distance between the two speakers is set to 2 m. FIG. 3B is a diagram showing a state in that the speakers which are conventionally generally used are arranged for reference in a manner similar to FIG. 3A. The sound image localization capabilities in these diagrams are the new concept., It is now assumed that the localization capability of the acoustic system is expressed by the reproducibility of the central sound source in a manner similar to the modulation transfer function MFT of an optical system is conveniently expressed by the resolution. Namely, the state in that the sound image can be localized at the center at a listening point is set to 1.0 and the state in that the sound image is localized on one speaker is set to 0. If the sound image is not localized as in the case of the opposite phases, it is determined that localization is impossible. The sound image localization capability can be fundamentally considered as a mental amount. The sound image localization capability depends on the physical amount which is expressed by the sound pressures and the difference between the arrival times due to the Haas effect as the mental conversion system of both of them. The sound image localization of the stereophonic sound system is inherently regarded as an imaginary based on the illusion of the hearing sense. If the sounds of the same sound pressure simultaneously arrived from the right and left speakers, the sound image is localized at the center. Therefore, the hot spot is suitable to reproduce the stereophonic sounds. However, if the arrival times of the sounds from the right and left speakers differ, even if their sound pressures are the same, the listener strongly feels the sound which has reached first. This is called a Haas effect. Since the difference between the arrival times certainly occurs at a listening point other than the center, even if the sound pressures which are generated from the right and left speakers are the same, the sound image is shifted toward the speaker near the listener, so that the localization capability deteriorates.

However, fortunately, the Haas effect also teaches that there is a compensation effect between the time difference and the sound pressure difference and 10 msec which is almost equivalent to 5 dB. For example, in FIGS. 3A and 3B, at the listening points (E and E') in the front areas which are 2 m away from the right speaker, the sound from the left speaker is delayed by 2.4 msec. Assuming that the Haas effect is linear in this area, this time delay is compensated by giving a sound pressure difference of 1.2 dB, so that the sound image is returned and localized to the center. Namely, the localization capability is set to 1. It is the key point to control the sound pressure in every direction, namely, to control the directivity in order to widen the hot spot to the sweet area as explained above.

In the case of arranging the right and left speakers as shown in FIG. 3A, the acoustic energy which is radiated toward the listening area is the half of the whole energy and the remaining energy is useless as the direct sound. The remaining acoustic energy is reflected by the wall or the like and becomes the indirect sounds. Since these indirect sounds are very close to direct sounds in time span, they may confuse the listening sense of direction. Then there is a case that asymmetrical directivity is desirable, since it can reduce unfavorable indirect sounds.

As a practical method of eliminating the indirect sounds, the following three methods can be mentioned.

Figure 4A:
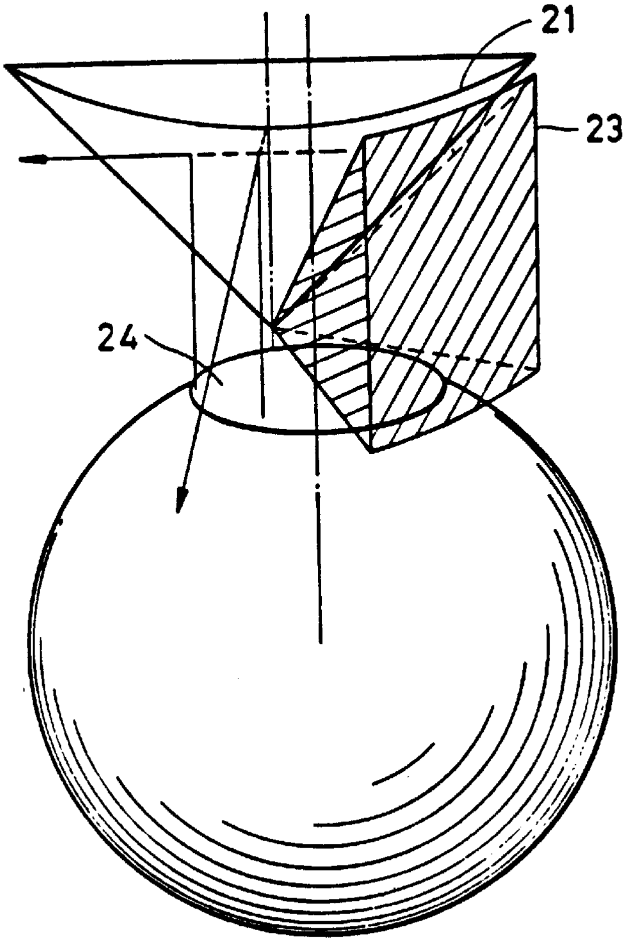
FIG. 4A is a diagram showing a schematic constitution of a sound output section according to another embodiment of the invention.
Figure 4B:
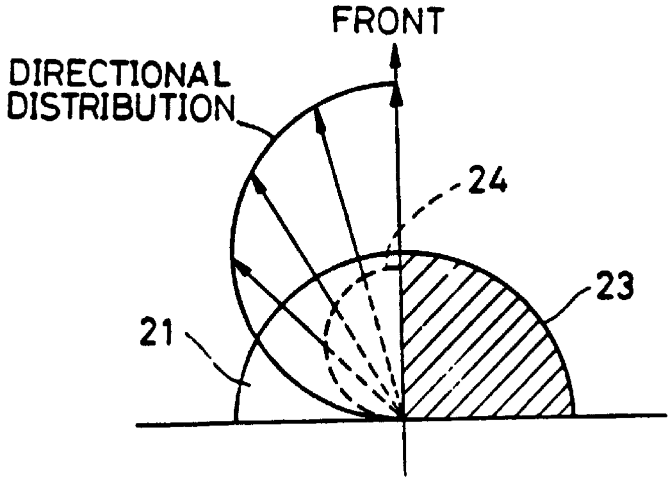
FIG. 4B is a diagram showing a directivity of the sound output section of FIG. 4A.

(1) Method whereby the audio mirror speakers each including a sound absorbing material are used:

FIGS. 4A and 4B are diagrams showing the principle of an audio mirror speaker including a sound absorbing material according to another embodiment of the invention. A sound absorbing material 23 is inserted between the speaker diaphragm 24 and the audio mirror 21, thereby absorbing the acoustic energies which are generated in the unnecessary directions. Such a sound absorbing material can be also used to control the directional distribution of the acoustic energy toward the listening area.

However, an attention needs to be paid to the points that the use of the sound absorbing material results in decrease in efficiency of the sound generating power of a speaker and that the sound absorbing effect changes in dependence on the kind, amount, shape, etc. of the sound absorbing material, so that this effect have frequency dependency.

(2) Method whereby asymmetrical type audio mirror speakers are used:

Although the audio mirror has been described with respect to the example of the rotary symmetrical unit, particularly, the cone or a part thereof, an audio mirror of another shape could be used.

According to the present computer technique, by inputting the shape of the diaphragm (opening plane) of the speaker a desired directional distribution, desired shape and arrangement of an audio mirror can be easily calculated. On the other hand, when considering the viewpoints of the practical designing and producing means, ceramics, porcelain, glass, or the like is also suitable as the material of the audio mirror from the viewpoint of the reflection performance, productivity, and interior.

Therefore, the asymmetrical type audio mirror speaker system is a useful system since the desired directional distribution is obtained without a deterioration of the efficiency, its material can be easily obtained, it can be easily designed, and the productivity is good.

(3) A third method is to use asymmetrical horn-loading directly. Since shape of the horn has direct influence on controlling directivity, it is possible to get similar effect to that mentioned above. Further description will appear later with reference to FIGS. 8A and 8B.

In the foregoing description it has been assumed that speakers having circular diaphragms are used. However other types of speaker may be used, for instance speakers could have: elliptical diaphragms, rectangular-shape diaphragms with rounded corners; square diaphragms. In addition Horn-loaded speakers could be used. There are various kinds of opening planes for Horns. Because in-phase sound produces a better sound image when reflected from the audio mirror, it is advantageous to use pistonic motion speakers.

Figure 1:
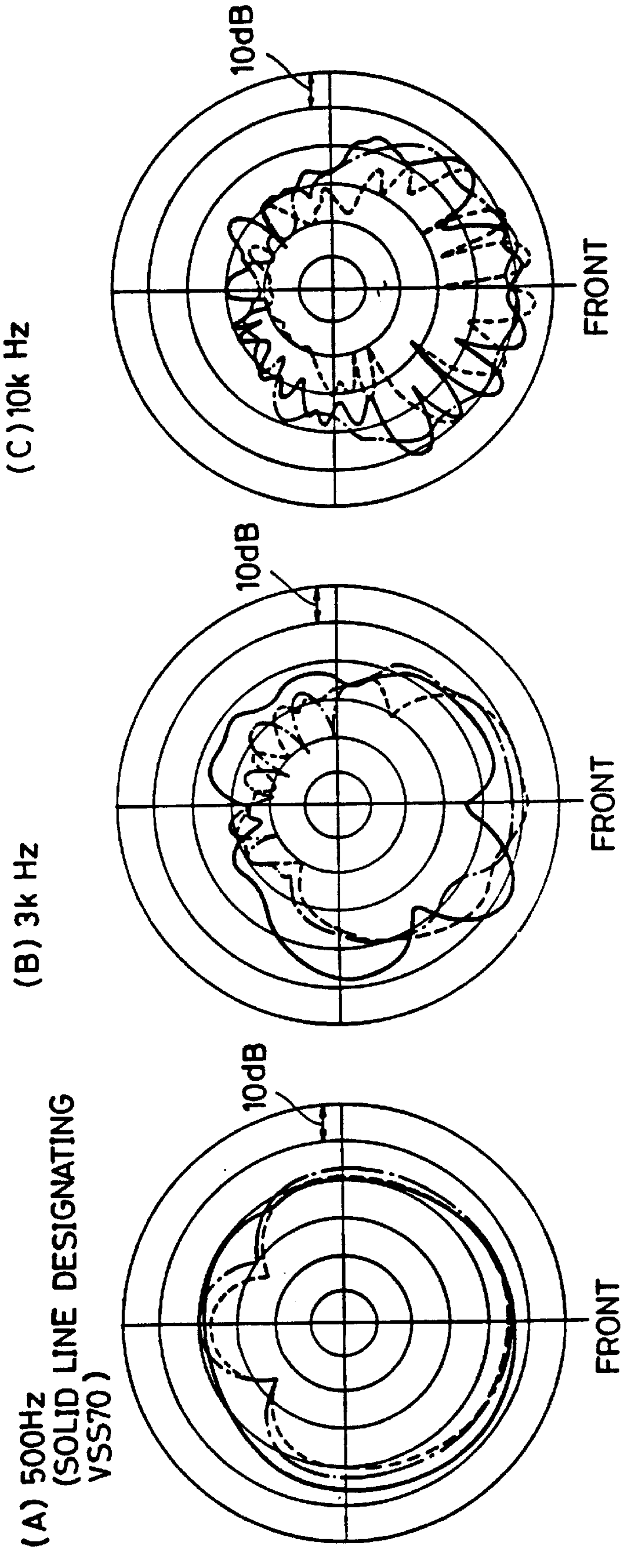
FIG. 1 PRIOR ART
FIG. 1 is a diagram showing a directivity of a conventional speaker system.

As is obvious from the above description, according to the embodiment, the compensating relation between the time difference and the sound pressure difference is derived in a wide area. Therefore, a wide sweet area is also derived at positions other than the hot spots existing on the perpendicular bisector of the line segment connecting the right and left speakers. On the other hand, in the ordinary speakers, as shown in FIG. 1, the directional distribution differs at every frequency and the peaks and dips of the sound pressure levels are large. The hot spot locates at only one point in the center. At other listening points, the sound image moves in the listening area at every frequency and cannot be localized.

However, the Haas effect has been reported by Helmut Haas in 1948. The compensating relation between the time difference and the sound pressure difference differs for every sound source which is used. It is not considered that this compensating relation is always the same as the compensating relation in the reproduction of the stereophonic system. There is also obviously an individual difference. Therefore, it is assumed that the qualitative analysis is appropriate at this stage. It is rather considered that, as in the foregoing embodiment, only when the system which can certainly control the directional distribution in a wide band is obtained, the Haas effect conversion coefficient as a mental amount can be measured by the stereophonic system. The results of the experiments in the present invention will be explained hereinafter.

Further, as mentioned in the foregoing prior art patent application, the wavelengths of the light and sound differ although they are regarded as the same kind of wave motion. In the case of the sound, the diffraction phenomenon cannot be ignored. In general, the audio mirror is not effective for the long wavelengths (low tones).

Figure 6:
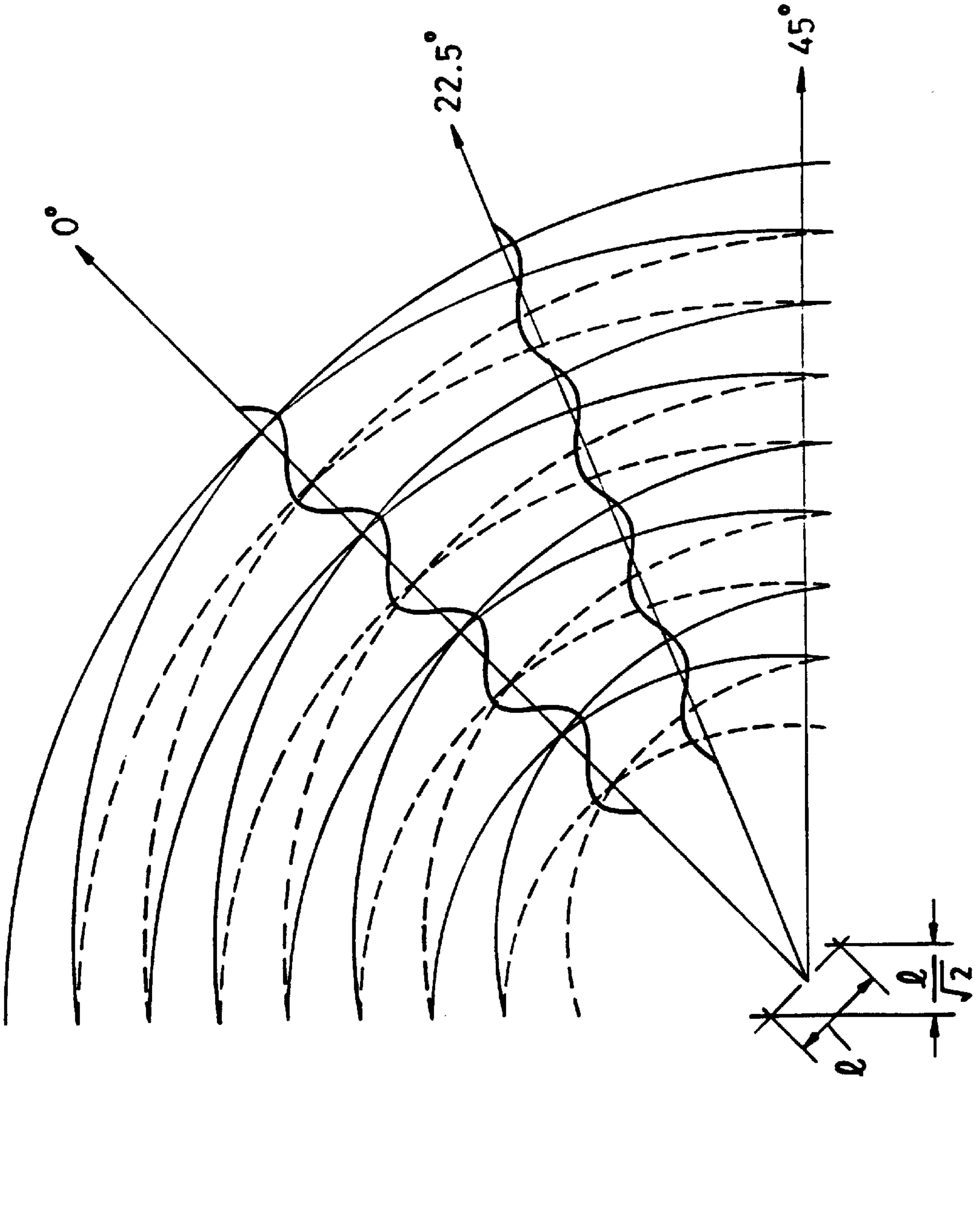
FIG. 6 is a diagram illustrating interference of sound waves.
Figure 7:
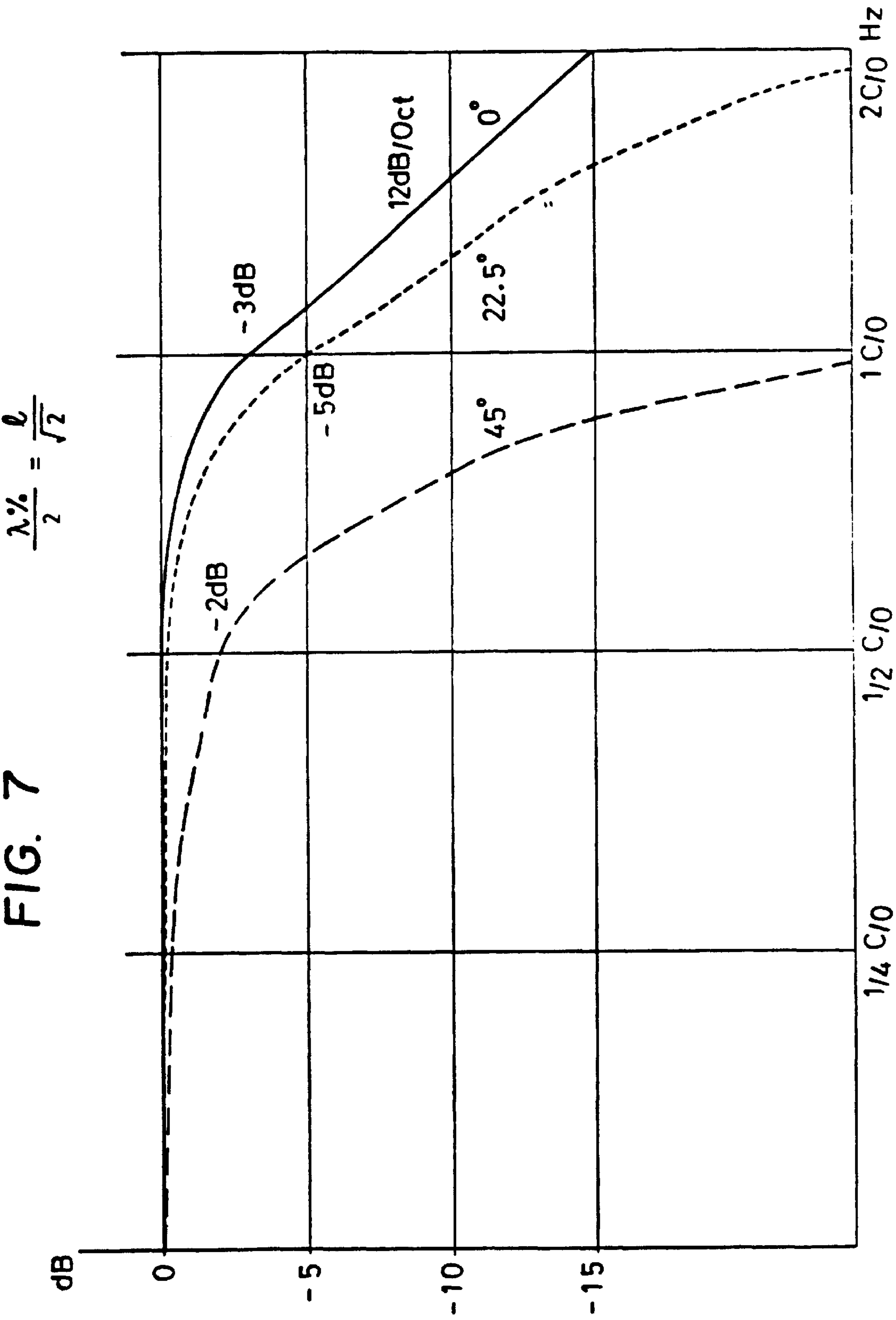
FIG. 7 is a gain-frequency diagram illustrating variation of gain with direction.

Interference is one of the alternatives for mid-low frequency when an effective audio mirror is hard to get. When two adjacent sources propagate same sound waves, interference does occur, thus directivity is a function of wavelength as well as the distance in between two speakers. FIG. 6 describes the principle whereas FIG. 7 explains relation in between frequency relative to crossover v.s. gain in dB. Solid line indicates main axis whereas short dotted line for 22.5° and long dashed line for 45°.

Though interference is frequency dependent, it is useful for low to mid-frequency where audio mirror is dull. In case of low frequency, dipole with variety of different phases provide useful directivity as well. An illustrative speaker system using interference is described with reference to FIG. 9. The frequency dependence will be covered by a multi-way arrangement.

Since the low tones spontaneously diffract, the low tones naturally become omnidirectional. In this sense, in the case of the low tones, it is difficult to compensate the arrival time difference due to the Haas effect by the directional distribution excluding the directional control by the interference such as in the dipole type or the like. However, fortunately, since the directivity of the low tones themselves is dull, the 3D stereo system is realized. No problem actually occurs.

As described above, it is a feature of one aspect of the present invention that the audio mirror speaker can control the directional distribution in a wide band almost independently of the frequency.

The present invention is also suitable for high quality stereo audio/visual system as well as the ordinary Hi-Fi stereo. This is because this system can provide the sweet area in which the stereophonic sounds first match with the service area of the video image. Namely, this is because the sweet area can be set in the visual sense perceiving systems of the visual sense and of the hearing sense at a position other than the center and the sense of the listener/viewer is confused. The foregoing VSS-70 of Pioneer Electronic Corporation has examined this problem, but the complete solution is not derived yet.

In the AV system, in many cases, a plurality of persons simultaneously enjoy as compared with the pure audio system in which a single person listens the stereophonic sound. Therefore, although no problem occurs when the video image is enjoyable at all the sweet area, it is improper that only the single person who exists at the center can enjoy the localized Hi-Fi sound. From this viewpoint, the present invention is obviously useful because the persons who exist at positions other that the center can also receive almost the equivalent audio and visual services. In addition, the present invention is the optimum as the basic speaker of the surrounding system.

The characteristics of the stereo speaker system according to the invention will be summarized as follows.

(1) The true Hi-Fi stereophonic sounds in terms of the theory and engineering, namely, the sound quality, phase, and directional distribution are controlled. Not only the hot spot as the apex of the isosceles triangle but also the stereophonic area having a sound image localization capability of a wide range, i.e., the sweet area are obtained.

(2) Since the directional distribution can be selected in accordance with the characteristic and condition of the reproduction sound field, the listener, and the like, the sweet area can be optimized.

(3) The multiway network can be also realized in a manner similar to the ordinary Hi-Fi speaker.

(4) The feature of the audio mirror speakers, i.e., the virtual sound sources are unconditionally determined by the shapes of the mirrors, shapes of the diaphragms, and mutual positional relations. The pseudo sound sources which are generated from the corners of the cabinets can be easily prevented.

(5) The present invention is also suitable for use in not only the pure audio system but also the AV or surrounding system.

Practical examples in the case of actually constituting the system as mentioned above will now be described hereinbelow.

(Practical Examples)

(1) Sweet area stereophonic speaker system of the 10-cm full-range type

A speaker module of the 10-cm full-range type made of Jordan Watts Co., Ltd. in U.K. was attached to the closed box designated by this company and was disposed such that the speaker module is directed upward. The conical audio mirror was disposed such that its apex was positioned at the outer peripheral surface of the speaker module as shown for example in FIG. 2B. Two sets of these speakers were prepared and located in a manner such that they are directed inwardly by the angle of just 45° as shown in FIG. 3A. The distance between the right and left speakers was set to 2 m. At the position away from the speakers by about 2.3 m, the sound image localization capabilities were measured using the guitar solo, human voice, and saxophone solo as the sound sources. Thus, all of the three persons have confirmed that the sweet area is obviously wide as compared with the case where the ordinary speakers were used (the foregoing speakers were set by the ordinary use method). There is the interesting fact that two areas obviously exist with respect to the hearing sense. Namely, the two areas exist at the positions near the hot spot and in the outside thereof. It is now assumed that the latter area is called a Haas area. The boundary line of those two areas is clarified when the listener moves while listening to the sounds. In particular, when the listener moves from the hot spot area to the Haas area, the localization feeling momentarily disappears. However, when the listener stays here for two or three seconds, the localization feeling is recovered. It is considered that this phenomenon concerns with the pulse width or the like of the auditory nervous system.

In the case of the ordinary setting of the speakers, even when the main axis of each speaker is directed inwardly by 30° and 45°, the hot spot area was narrow and no Haas area existed.

(2) Use of the sound absorbing material

The arrangement described in the above item (1), was modified in that the sound absorbing material was disposed in the portion in the direction where the sound energy is not directly radiated toward the listening area: this is shown in FIG. 4A. Although the whole sound pressure level decreased by about 2.5 to 3 dB, the sounds were felt as if the sweet area was enlarged in terms of the hearing sense. In particular, it was considered that the crosstalk in the high band reduced. It has been confirmed, however, that the difference between the above items (1) and (2) excluding the sound pressure depends on the condition such as listening room or setting of the speakers.

(3) Use of the asymmetrical type mirrors

Figure 5A:
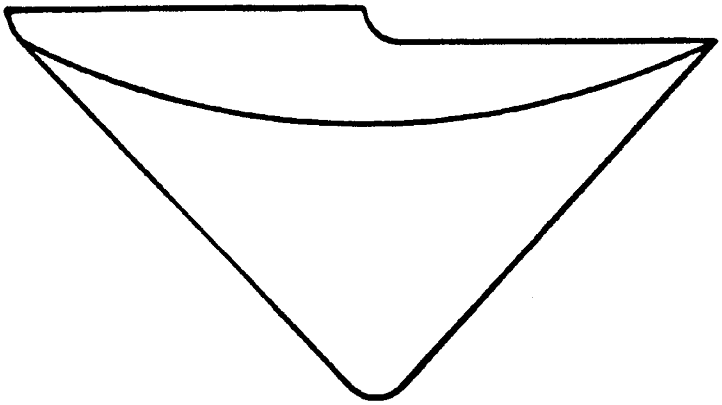
FIGS. 5A and 5B are diagrams showing an audio mirror in still another embodiment of the invention.
Figure 5B:
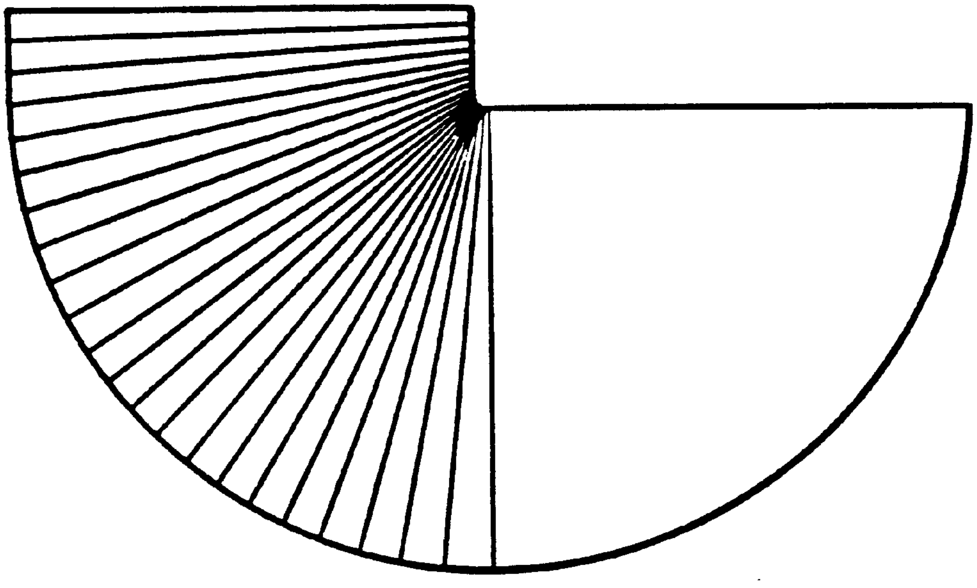

The arrangement described above in the item (1), was modified in that an asymmetrical type mirror as shown in FIG. 5 was used. This mirror has an effective reflection plane of 180°. The reflection plane of 90° is formed like an ordinary cone and the remaining portion of the other 90° is formed such that the cone slowly conically extends; however, a constant angle of 45° from the central axis is always held. The directional distribution can be effectively controlled by the relative positional relation between the asymmetrical mirror and the speaker diaphragm. For example, when the spiral portion was used to prevent the reduction of the sound pressure level mentioned in the item (2) and to minimize the directional distribution in the unnecessary directions, the effect similar to that in the item (2) was derived without reducing the sound pressure level.

(4) Two-way type sweet area speaker system

A sub-woofer to radiate the low tones at frequencies of 150 Hz or lower was connected to the speaker module in the item (1) by use of the crossover network of 12 dB/oct. Although the sub-woofer is omnidirection, the sweet area was almost equal to that in the item (1).

(5) Flat cone speakers with reflector

A 7.5 cm full range flat cone speaker made by Blaupunkt was equipped with a sealed box. Listening test revealed that the flat cone provides less distortion and better image. It is understood that flat cone avoids interference between the incidental wave and the reflected wave, since waves cross each other at 90°.

In case of ordinary conical cone, the form of sound wave near to the speaker is very complicated. Therefore, incidental and reflected waves interfere with each other, degradating the sound quality.

It is also important that the cone should make pistonic motion otherwise integration of point sound sources along a particular direction by the audio mirror reflector does not make sense. From this context, horn loading type of speaker is attractive, since it will provide flat wave form too.

(6) Dipole Sub-Woofer

Case (5) above employs a small speaker; therefore, the low frequency is not sufficient. To enhance the low frequency, a dipole sub-woofer is introduced. The most well known one is System 6000 by Celestion International Ltd. U.K. Unlike ordinary sub-woofer, dipole sub-woofer has directivity; therefore, it is preferable for Haas effect. On the other hand, it is necessary to consider the reflection from the wall. This reflected wave does not play any significant role on Haas effect since it arrives later, though the tonal balance would be influenced. In our experiment, the balance between Haas effect and tonal balance has been attained by setting dipole sub-woofer at same direction as mid-high speaker.

(7) Asymmetrical Horn loading speaker

Figure 8A:
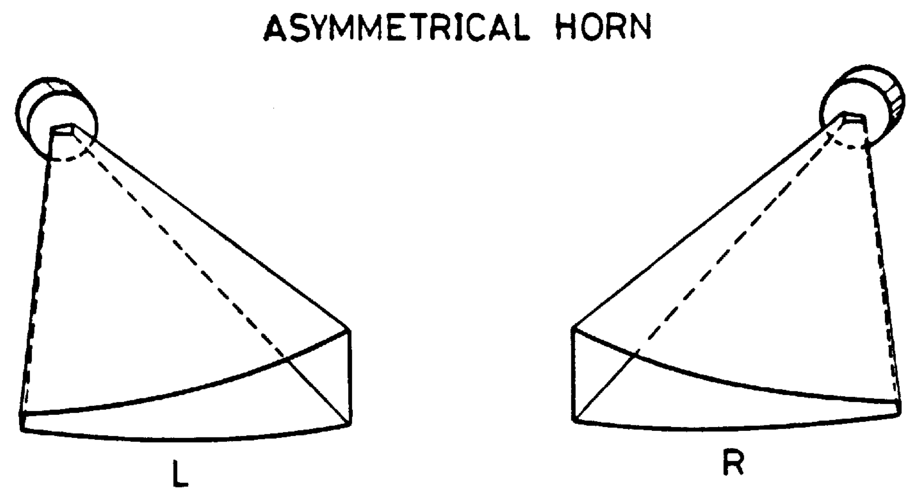
FIGS. 8A and 8B show asymmetrical horn loaded speakers and corresponding directivity patterns in accordance with the invention.

It is known that horn loading speaker can control the directivity. Normally, the purpose of designing a horn is to get uniformity in the area of its target. FIG. 8A shows asymmetrical Horns loading left L and right R speakers.

Figure 8B:
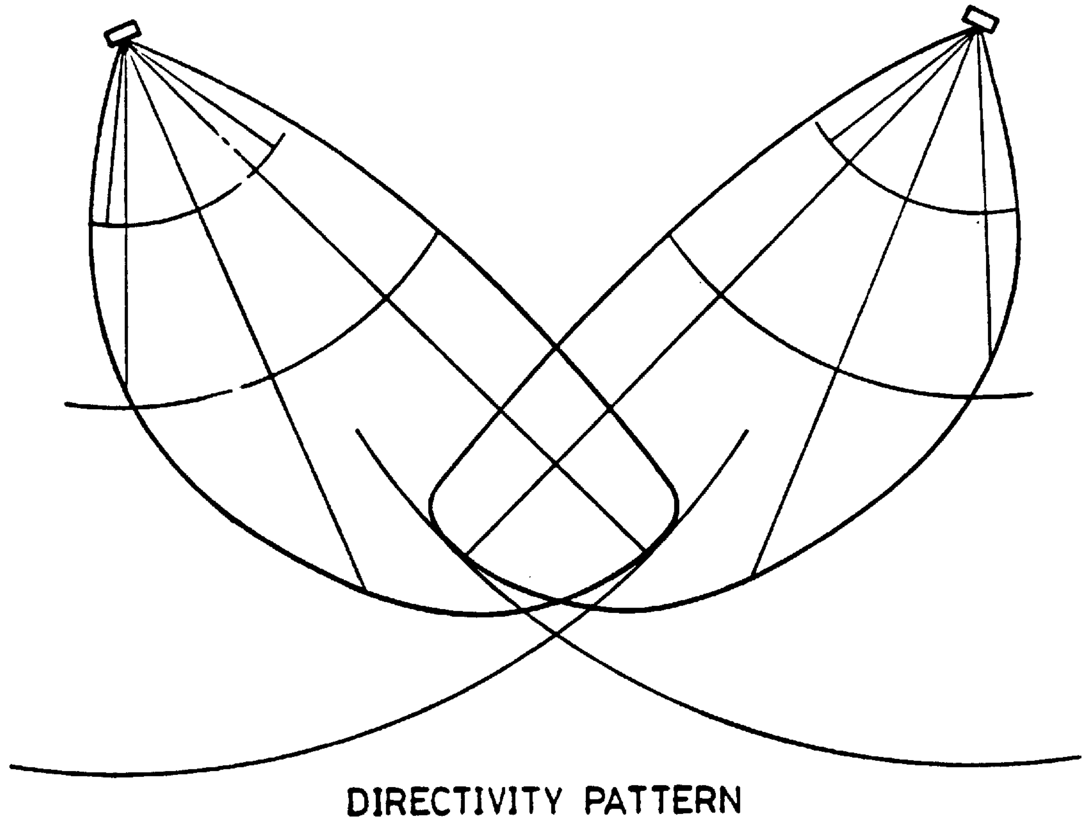

In case of the invention, an asymmetrical horn has been introduced to achieve Haas effect directly, FIG. 8B showing an illustrative directivity pattern produced by the asymmetric horns. From a practical point of view, this asymmetrical horn loading system is suitable for mid-high frequency range because of its physical size.

(8) 3 frequency band system

Figure 9A:
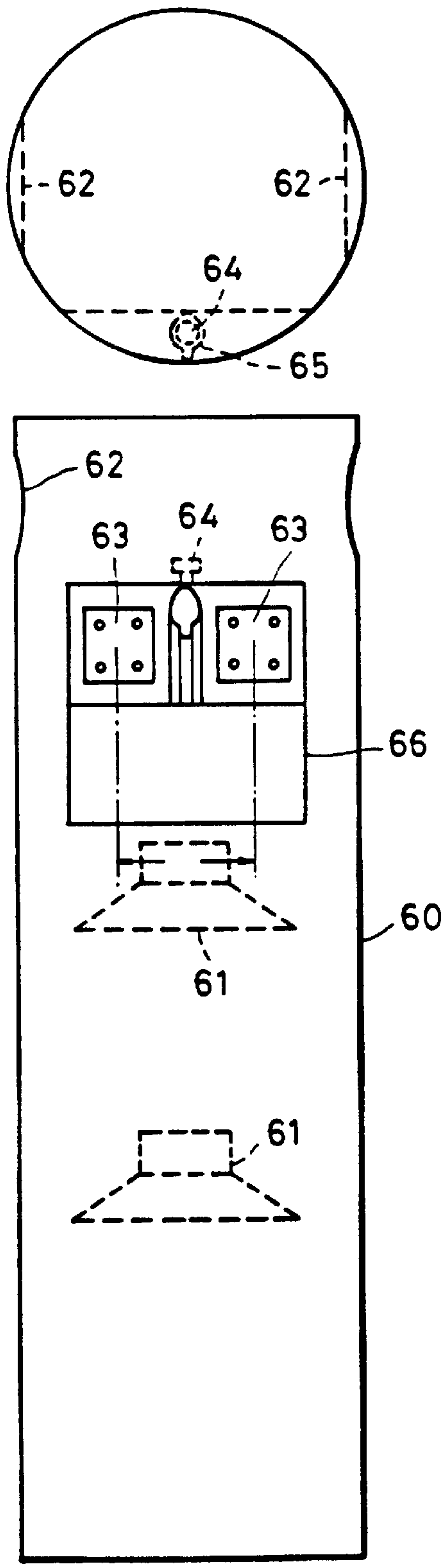
FIGS. 9A and 9B are front and side elevational views respectively, together with top plan views, of a speaker system in accordance with the invention.
Figure 9B:
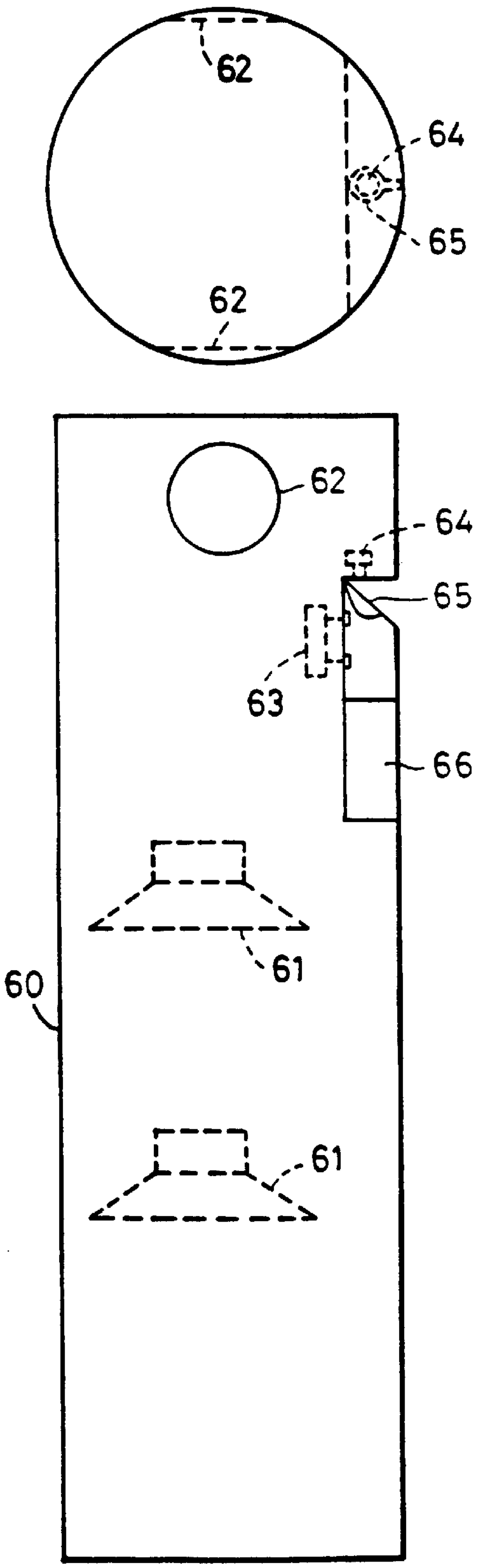

Referring to FIGS. 9A and 9B, a 3 frequency band loudspeaker system is shown. The loudspeaker system comprises a hollow cylindrical column 60 of material known in the art of speaker design to be suitable. Examples include cardboard and PVC. The column may have sound dampening material in it. In the system shown in FIG. 9, the column contains a pair of woofers 61 whose axes are parallel to the axis of the column, a pair of diametrically opposite sound output ports 62 being provided near the top of the column for the woofers. At the front of the column is an opening in which there is provided a pair of identical mid-range speakers 63, the centers of which are spaced by a predetermined distance in the plane common to both speakers. Also provided at the front opening are a downwardly directed tweeter 64 facing a conical audio mirror 65 supported on a support of sound absorption material 66. As known to be advantageous in the art at least the tweeter 64 and the mid-range speakers 63 are preferably pistonic-motion speakers. The mirror 65 is a sector of a conical surface, the vertex of the cone being displaced from the central axis of the tweeter 64, as shown in FIG. 9B.

Figure 9C:
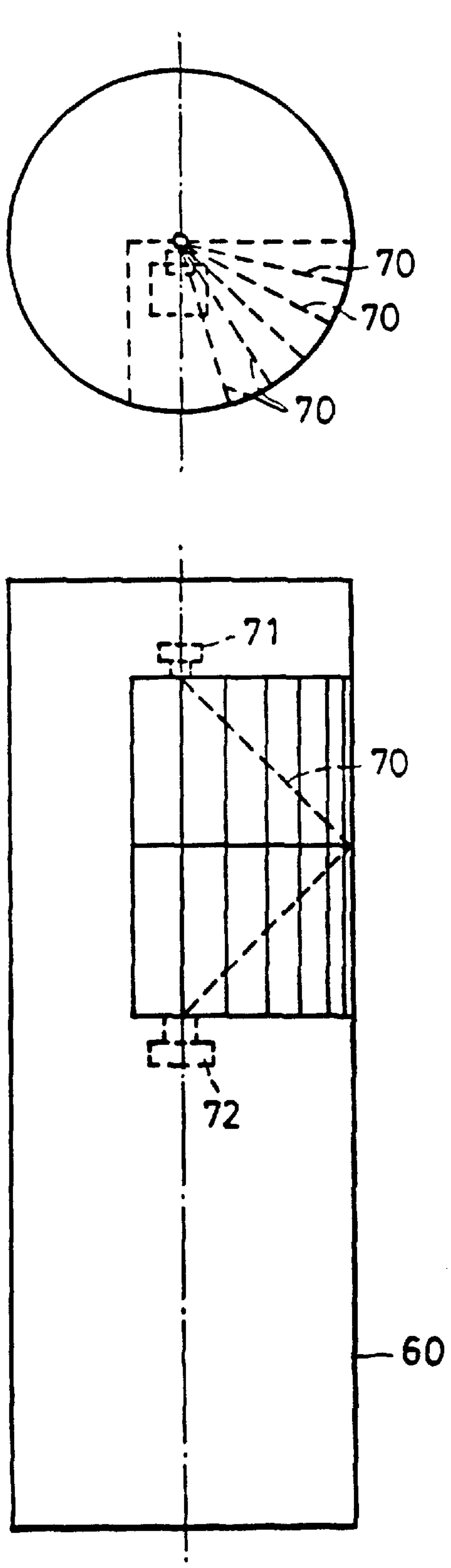
FIG. 9C comprises front and side elevational views together with top plan views of a modification applicable to FIGS. 9A and 9B.

A modification of the system of FIGS. 9A and 9B is shown in FIG. 9C.

Sound Waves having a wavelength which is large relative to the size of the speaker producing them tend to diffuse immediately after the waves are produced by the driver of the speaker. Thus directivity of lower (i.e. longer wavelength) tones of the mid/high tones is impaired. To control the directivity of such tones one or more control fins may be introduced into the speaker column, as shown in FIG. 9C.

As shown in the illustrative embodiment of FIG. 9C, several control fins 70 are provided. The fins 70 are triangular flat plates. The plates extend radially of the hollow cylindrical column 60 over a quadrant thereof.

Above the fins is a tweeter loudspeaker 71 directed axially downwardly of the column. Below the fins is a mid range loudspeaker 72 directed axially upwardly of the column.

The fins act like sound waveguides so that the directivity of larger wavelengths is controlled, as if the effective sound wave propagation starts at the radially outer peripheries of the fins.

The fins may be used with audio-mirror speakers or with horn-loaded speakers.

The fins may have shapes other than triangular.

Figure 10:
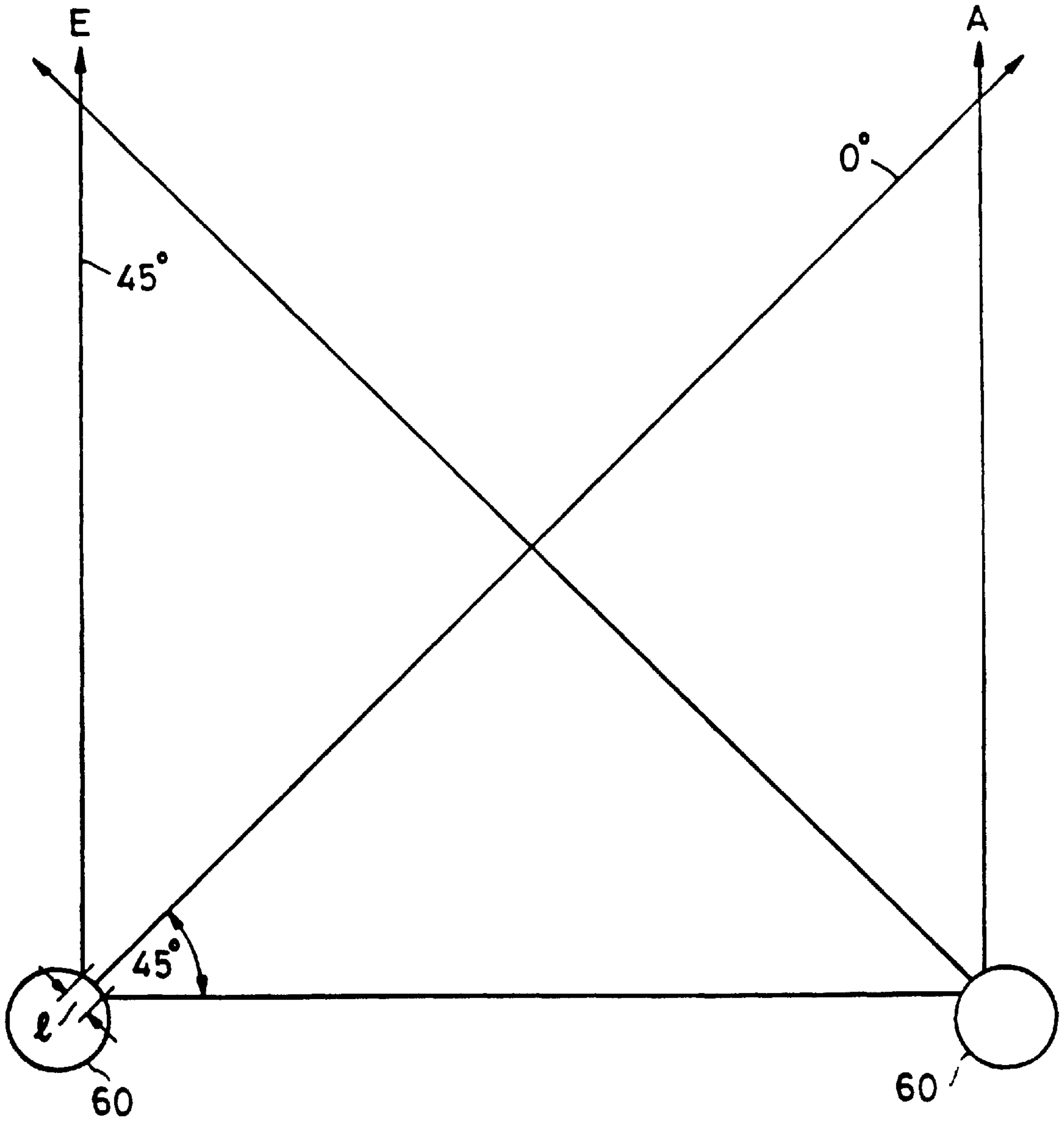
FIG. 10 is a diagram showing the layout of a stereo speaker system using the speaker system of FIG. 9.

Referring to FIG. 10, the two speaker columns 60 are spaced about 2 meters apart with the mid range speakers 63 directed at 45° to the base line connecting the columns; the arrangement is thus similar to that shown in FIG. 3A. Referring to the left hand speaker column 60, a sound wave from both of the speakers 63 will be in phase at position A, ie along the 0° axis. However at position E, ie along the 45° axis, sound waves from the speakers will have the phase difference corresponding to the length $$\frac{l}{\sqrt{2}}.$$

Thus when the wavelength is given by $$\lambda co/2 = \frac{l}{\sqrt{2}}$$

destructive interference occurs along the 45° axis. Thus control of signal gain with direction is achieved. At other frequencies and angles, other signal gains are achieved as will be clear to those skilled in the art.

For the woofers 61 a similar effect is achievable by virtue of the spacing of the output ports 62.

The tweeter 64 produces high frequency sound waves which are reflected off the audio mirror 65. The mirror 65 is so shaped and arranged that it too produces a desired control of signal gain with direction.

Figure 11:
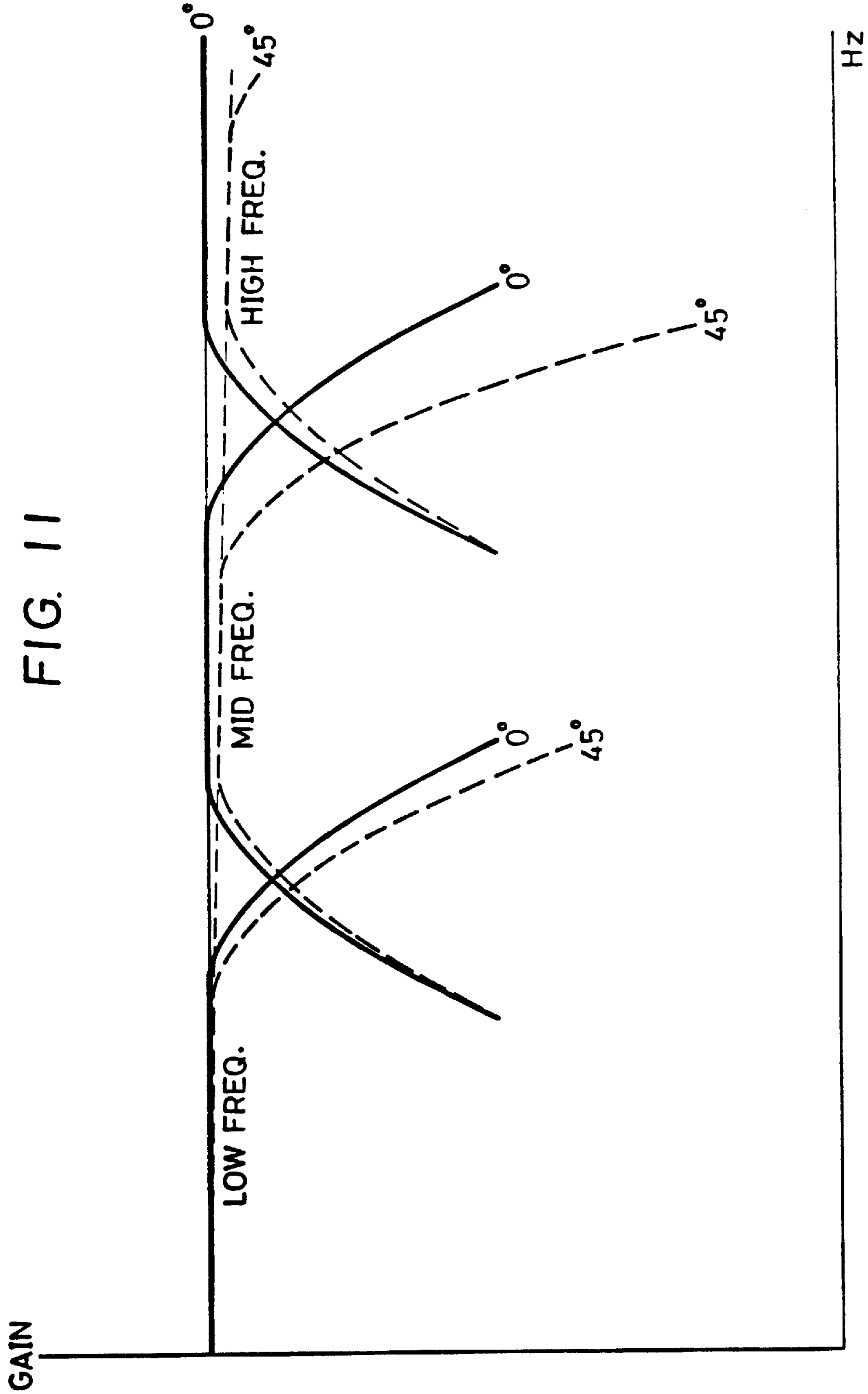
FIG. 11 is a diagram showing the variation of gain with frequency and direction of the system of FIG. 9.

By adjusting the frequencies responses of the speakers 61, 63, and 64, by means known in the art, an approximately "flat" frequency response in the 0° direction can be provided as shown by the continuous line in FIG. 11.

As discussed above, the variation of response with direction of the speakers 61, 63 and 64 (together with mirror 65) can be controlled. Thus as shown by the dashed line, the combined frequency response of the speakers in the 45° can also be approximately "flat" although it may deviate from the 0° frequency response.

The use of two speaker systems 60 arranged as shown in FIGS. 9 and 10 produces a stereo image, not only along a line bisecting and perpendicular to the base line connecting the columns 60, but also over a wider area, eg as shown at A, B, C, D and E in FIG. 3A.

(9) A "three-dimentional" system

Two speaker systems spaced apart along a base line and having main excess of sound output at 45 degrees to the base line produce medium/high tones, with the desired directivity pattern to produce the Haas effect over a wide listening area. Because low tones have little directivity as sensed by human beings, the low tones for both stereo channels are combined and produced from a single woofer or sub-woofer.

In various illustrative examples of the invention described hereinbefore, two (left and right) speakers (or speaker systems) are spaced apart along a baseline and have a main axis of sound output angled at about 45 degrees to the baseline. That angle may have other values less than 45 degrees.

The angle of about 45 degrees is important because it reduces interference between directly incident sound waves and waves reflected from e.g. the wall of a room containing the system. Angles less than 45 degrees may be used but there is less reduction of interference.

Figure 12A:
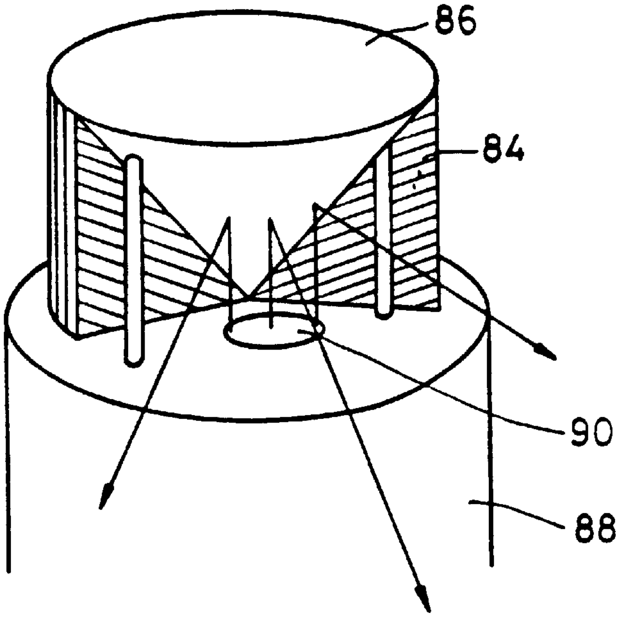
FIGS. 12A and 12B are perspective and schematic plan views, respectively, of a modified speaker unit.
Figure 12B:
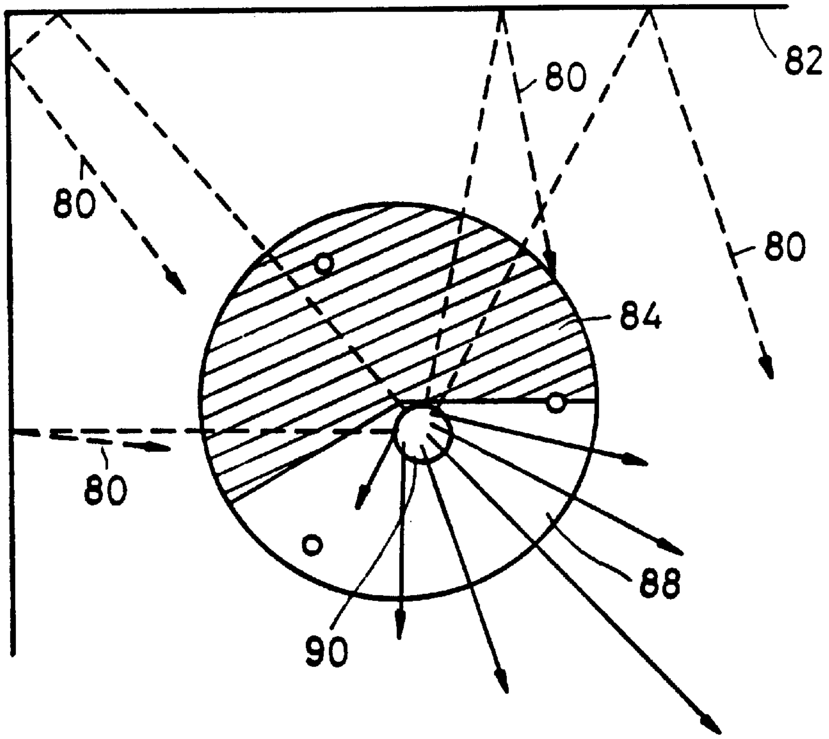

In the following description of modifications and developments to systems of the above-mentioned embodiments the use of absorbing material is described with reference to FIGS. 4A and 4B. Referring to FIGS. 12A and 12B, it has been noted that unwanted dispersion/diffraction and or secondary reflection (sound waves 80) at a nearby wall 82 causes "smearing" of the sound localization in the listening area. In order to reduce this, or prevent it happening, a mass of sound absorbing material 84 is disposed between the conical acoustic mirror 86 and the cabinet 88 for the speaker 90 in such a position as to block the sound waves which would otherwise cause such smearing. As can be seen from FIGS. 12A and 12B, the absorbent material 84 is in the form of a sector of a circular cylinder extending through an angle of about 210 degrees and having an upper conical depression to receive the acoustic mirror 86.

Figure 13:
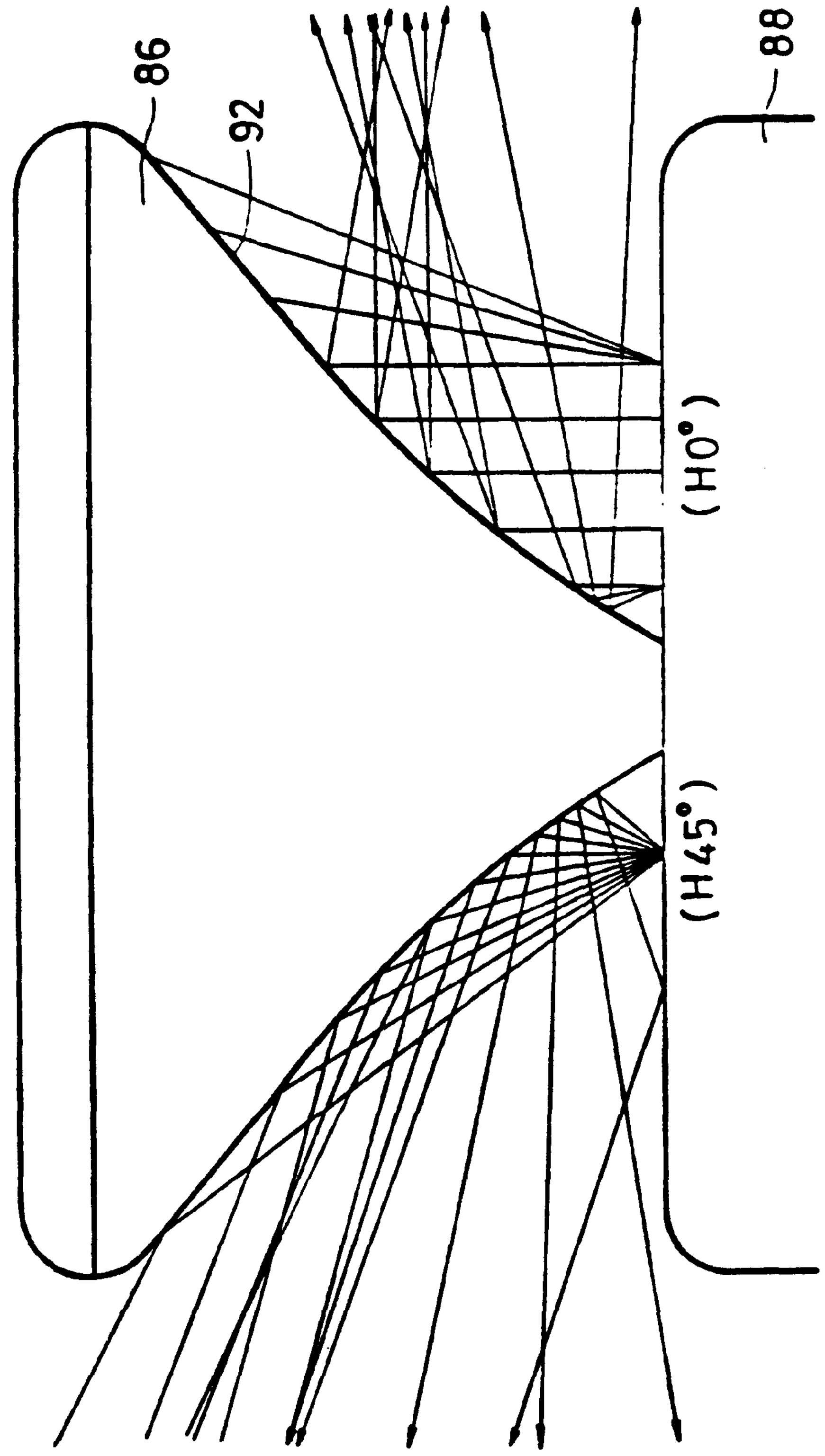
FIG. 13 is a side view of an acoustic mirror.

Referring now to the conical mirror 21 shown in FIGS. 2A and 2B and in FIGS. 12A and 12B, it has been noted that there is a difference of sound localization between a sitting position and a corresponding standing position away from the "hot spot" in the listening area. It is assumed that the reflected sound waves from the conical mirror tend to be localized in a horizontal plane. In order to provide localization in both a sitting position and standing position, the conical mirror may be formed with a slightly curved generator such that the sound waves reflected by the mirror diverge in the vertical direction. As shown in FIG. 13, the generator 92 of the mirror 86 is slightly concave, but it may, alternatively, be slightly convex. It has been found that, with such an arrangement, the sound quality is still acceptable and that localization is less dependent on listening height.

Figure 14:
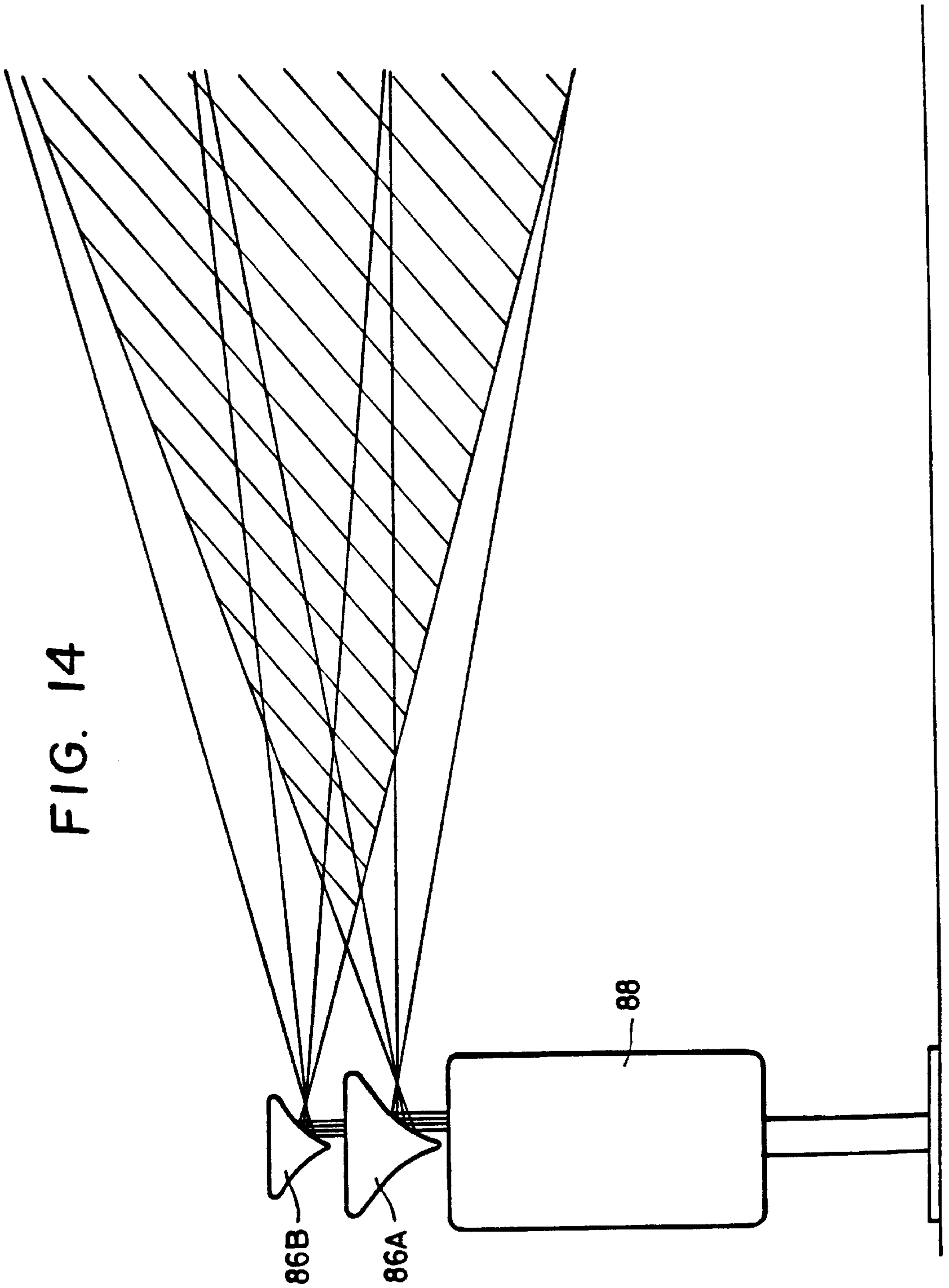
FIG. 14 is a side view of a speaker unit having a pair of acoustic mirrors of the type shown in FIG. 13.

FIG. 14 illustrates a multi-way speaker unit in which different acoustic mirrors 86A, 86B with slightly concave generators are disposed one above the other for reflecting the sounds from different speakers 88A and 88B in the cabinet 88.

It has also been noted that two-channel stereo gives an elevated sound image for vocal reproduction. In a further modification of the systems disclosed above, in order to prevent this phenomenon, the vertical axis of the speaker is tilted towards the main radiation direction of the speaker unit. Alternatively, the axis of the conical mirror may be tilted towards the main radiation direction.

I claim:

1. A stereophonic sound output system comprising:

a pair of left and right speakers, each speaker having a cabinet, a diaphragm contained in the cabinet and a conical or part conical sound mirror spaced from the diaphragm with an apex of the sound mirror coinciding with a rim of the diaphragm so as to define a direction in which sound is preferentially radiated towards a listening area, said diaphragm being arranged on a surface of the cabinet which is opposite to the sound mirror; and a sound control material which is inserted between the surface of the cabinet and the sound mirror in a predetermined angular area where sound energy is not directly radiated towards the listening area so as to control the directional distribution of acoustic energy radiated towards the listening area by blocking acoustic energies which are reflected in unnecessary directions, said sound control material filling a space between the surface of the cabinet and the sound mirror in the predetermined angular area.

2. A system according to claim 1, wherein said pair of speakers are pistonic motion speakers.

3. A system according to claim 1, wherein the speakers are spaced apart along a base line of a triangle and centers of the directions of sounds which are respectively output from said pair of speakers are directed towards an apex of the triangle by said audio mirrors, the centers of the directions of said sounds being at 45° or less to said base line.

4. A system according to claim 1, wherein the speakers are such as to output predominantly median and high tones and further comprising right and left speakers for outputting predominantly low tones.

5. A system according to claim 1, wherein said sound control material has an outer cylindrical surface a diameter of which corresponds to that of the sound mirror.

6. A system according to claim 1, wherein said sound control material has a part-cylindrical shape and an axis of the sound control material is coincident with an axis of the sound mirror.

* * * * *